(12) United States Patent
Chen et al.

(10) Patent No.: US 8,680,909 B2
(45) Date of Patent: Mar. 25, 2014

(54) LAYER-ID DETECTOR FOR MULTILAYER 3D-IC AND METHOD OF THE SAME

(71) Applicant: National Tsing Hua University, Hsin Chu (TW)

(72) Inventors: Ming-Pin Chen, Kaohsiung (TW); Meng-Fan Chang, Taichung (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 13/732,028

(22) Filed: Dec. 31, 2012

(65) Prior Publication Data

US 2013/0257503 A1    Oct. 3, 2013

(30) Foreign Application Priority Data

Mar. 30, 2012  (TW) .............................. 101111498 A (51) Int. Cl.
*G06F 1/04*   (2006.01)

(52) U.S. Cl.
USPC ........................................................ 327/291

(58) Field of Classification Search
None
See application file for complete search history.

(56) References Cited

U.S. PATENT DOCUMENTS 8,040,155 B2 * 10/2011 Tran Vo et al. .................. 326/93
2011/0311018 A1 * 12/2011 Chen et al. ...................... 377/47

* cited by examiner

*Primary Examiner* — An Luu
(74) *Attorney, Agent, or Firm* — Muncy, Geissler, Olds & Lowe, P.C.

(57) ABSTRACT

A layer-ID detector for multilayer 3D-IC, including a random generator to generate a random signal, a layer-ID designation mechanism circuit coupled to the random generator to generate a layer-ID designating signal, and a counter coupled to the layer-ID designating signal to output a layer-ID signal.

18 Claims, 6 Drawing Sheets

LAYER-ID DETECTOR FOR MULTILAYER 3D-IC AND METHOD OF THE SAME

FIELD OF THE INVENTION

The present invention relates to a three-dimensional (3D) stacked chip device, and more particularly to an initiation type layer-ID detector for a 3D-IC.

BACKGROUND OF THE INVENTION

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability.

For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, a stacked type semiconductor device formed of at least two stacked semiconductor integrated circuit devices is provided, each of which is formed with a specification and includes a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, including a size of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

HITACHI proposed a method for identifying semiconductor integrated circuit device and the U.S. patent publication number is 20050263605. It proposes providing a plurality of identification elements having the same arrangement and physical parameters for identification. For instance, ELPIDA MEMORY INC. disclosed a stacked type semiconductor memory device and chip selection circuit and the U.S. patent publication number is 20070126105. It provides a stacked type semiconductor memory device in which when selecting a desired semiconductor chip among a plurality of stacked semiconductor chips, a plurality of chip identification numbers different from each other can be automatically generated by a plurality of operation circuits connected in cascade, and the desired semiconductor chip can be reliably selected by a unique identification number assigned to each semiconductor chip using the semiconductor chips having the same structure without employing a complicated structure or particular control. In the prior art, a calculated output of an increment circuit of a last stage among M increment circuits connected in cascade may be used to determine the number M of the semiconductor chips. By this, when the number of stacked type semiconductor devices is unknown, the correct number of semiconductor chips can be reliably recognized. A further prior art U.S. Pat. No. 7,494,846 is disclosed by Taiwan Semiconductor Manufacturing Company, Ltd., filed on Mar. 9, 2007. It disclosed a semiconductor structure including a first semiconductor die and a second semiconductor die identical to the first semiconductor die. The first semiconductor die includes a first identification circuit; and a first plurality of input/output (I/O) pads on the surface of the first semiconductor die. The second semiconductor die includes a second identification circuit, wherein the first and the second identification circuits are programmed differently from each other; and a second plurality of I/O pads on the surface of the second semiconductor die. Each of the first plurality of I/O pads is vertically aligned to and connected to one of the respective second plurality of I/O pads. The second semiconductor die is vertically aligned to and bonded on the first semiconductor die.

Furthermore, the Through-Silicon-Via (TSV) technology which offers vertical connection has emerged as a promising solution in 3-D stacked devices. It is a technology where vertical interconnects is formed through the wafer to enable communication among the stacked chips. One of the related articles may refer to IEEE, JOURNAL OF SOLID-STATE CIRCUITS, VOL. 45, NO. 1, JANUARY 2010, entitled: "8 Gb 3-D DDR3 DRAM Using Through-Silicon-Via Technology". In the article, a 3-D DRAM with TSVs is proposed which overcomes the limits of conventional module approaches. It also discloses how the architecture and data paths were designed. 3-D technologies including TSV connectivity check and repair scheme, and power noise reduction method are also disclosed. TSVs can be formed simply after fab-out so that no special process integration during the normal process flow is required. Chip identification (ID) is typically assigned.

After the same or different chips are stacked to form a three-dimensional chip, in order to select a desired chip among multiple chips of 3D-IC device to operate, when the system operates, every chip of the 3D-IC device have to be identified a layer-ID (layer identification number) to select the designated chip to operate. Many methods for identifying a layer-ID are proposed in the past. However, they not only increase the cost, but still cannot overcome the problem that the more stacked chips of 3D-IC device, the more electrodes.

The present invention provides a novel method for 3D-IC identify.

SUMMARY OF THE INVENTION

One aspect of the present invention is to provide an initiation type layer-ID detector for 3D stacked chip device and the method thereof.

The present invention provides an initiation type layer-ID detector for multilayer 3D-IC, including a random generator to generate a random signal; a layer-ID designation (voting) mechanism circuit coupled to the random generator to generate a layer-ID designating signal; and a counter coupled to the layer-ID designating signal to output a layer-ID signal.

The layer-ID designation (voting) mechanism circuit includes a first flipflop. An output of the random generator is coupled to an input end of the first flipflop, and a clock (CK) end of the first flipflop is coupled to an output end of a first AND gate. A first input end of the first AND gate is coupled to a clock signal, and an output end of the first flipflop is coupled to a first input end of a second AND gate. A second input end of the second AND gate is coupled to an output end of a second flipflop while a reset end of the second flipflop is coupled to a reset signal. An output of the second AND gate is coupled to a first input end of a third AND gate and a second input end of the first AND gate, and a common end of the output of the second AND gate and the second input end of the first AND gate is coupled to a $V_{EN}$ input end (negative input end) of an operational amplifier. A positive input end of the operational amplifier is coupled to a reference voltage ($V_{REF}$) while a second input end of the third AND gate is coupled to an output end of the operational amplifier. An output of a fourth AND gate is coupled to a clock input end of the counter.

A reset end of the counter is coupled to a reset signal to output a layer-ID signal. A fifth AND gate is coupled to a reset end of the first flipflop to input a reset signal, a load signal or $V_{EN1}$. The second input end of the third AND gate is coupled to a first input end of the fourth AND gate, and the other input ends of the fourth AND gate are coupled to a lock signal and a $V_{EN1}$ input signal respectively.

The present invention provides a method for detecting an initiation type layer-ID for multilayer 3D-IC, including providing a random generator, a layer-ID designation (voting) mechanism circuit and a counter; generating a random signal by the random generator and inputting the random signal into the layer-ID designation mechanism circuit to generate a layer-ID designating signal; and generating a layer-ID signal based on the layer-ID designating signal by the counter.

The method further includes resetting a lock signal to be 1 and letting an output of the counter to be i=0, wherein i is an identification number; setting a reference voltage to be between $V_{DD}/N$ and $2V_{DD}/N$; and inputting the reference voltage into a positive input end of an operational amplifier of the layer-ID designation mechanism circuit. The method further includes loading the random signal from the random generator to the layer-ID designation (voting) mechanism circuit and determining whether the random signal is 1; if so, determining whether a load signal is 1; if so and an enable voltage ($V_{EN}$) is smaller than the reference voltage, determining whether $V_{EN1}$ is zero; and if so, the lock signal being zero and outputting the layer-ID signal by the counter.

The method further includes obtaining one bit from the random generator by each layer; if a value of the bit is "0", keeping unchanged; if the value of the bit is "1", obtaining another value again; and determining when only one "1" remains in a voting mechanism and letting the lock signal to be "0". If the random signal is not 1, repeating the step of loading the random signal from the random generator. If the load signal is not 1, reloading the random signal from the random generator. If the $V_{EN1}$ is not zero, reloading the random signal from the random generator.

BRIEF DESCRIPTION OF THE DRAWINGS

The aforementioned elements and other features and advantages of the present invention will become apparent from the following description of preferred embodiments taken together with the accompanying drawings, wherein.

DETAILED DESCRIPTION OF THE PREFERRED EMBODIMENT

The invention will now be described in detail with the preferred embodiments and the accompanying drawings. It shall be appreciated that all of the preferred embodiments in the present invention are only for illustrating but not for limiting the claims of the invention. Therefore, except the preferred embodiments in the specification, the present invention may also be widely used in other embodiments. The present invention should not be limited to any embodiments, except by the following claims and their equivalents.

The present invention provides an initiation type layer-ID detector for 3D-IC and the method thereof. The present method mainly utilizes layer-ID designation (voting) mechanism. Each layer obtains one bit from a random generator. If the value of the bit is "0", keep unchanged. If the value of the bit is "1", obtain the value again. Furthermore, the present method employs the characteristics of the random generator and an operational amplifier (OP) to determine when only one "1" remains in the voting mechanism, and then let the lock signal to be "0". The output CM1 of AND gate 104 in the figures remains to be "0" and will not change anymore when the lock signal is "0"; the value of a counter is also locked and a layer-ID signal is outputted. For remaining unlocked layers, continue to the next round with the value of the counter plus one and re-obtained CM. The number of the layers which join the voting will subtract one every time because the value of CM1 connected with the resistance R remains to be "0" after locked.

Figure 1:
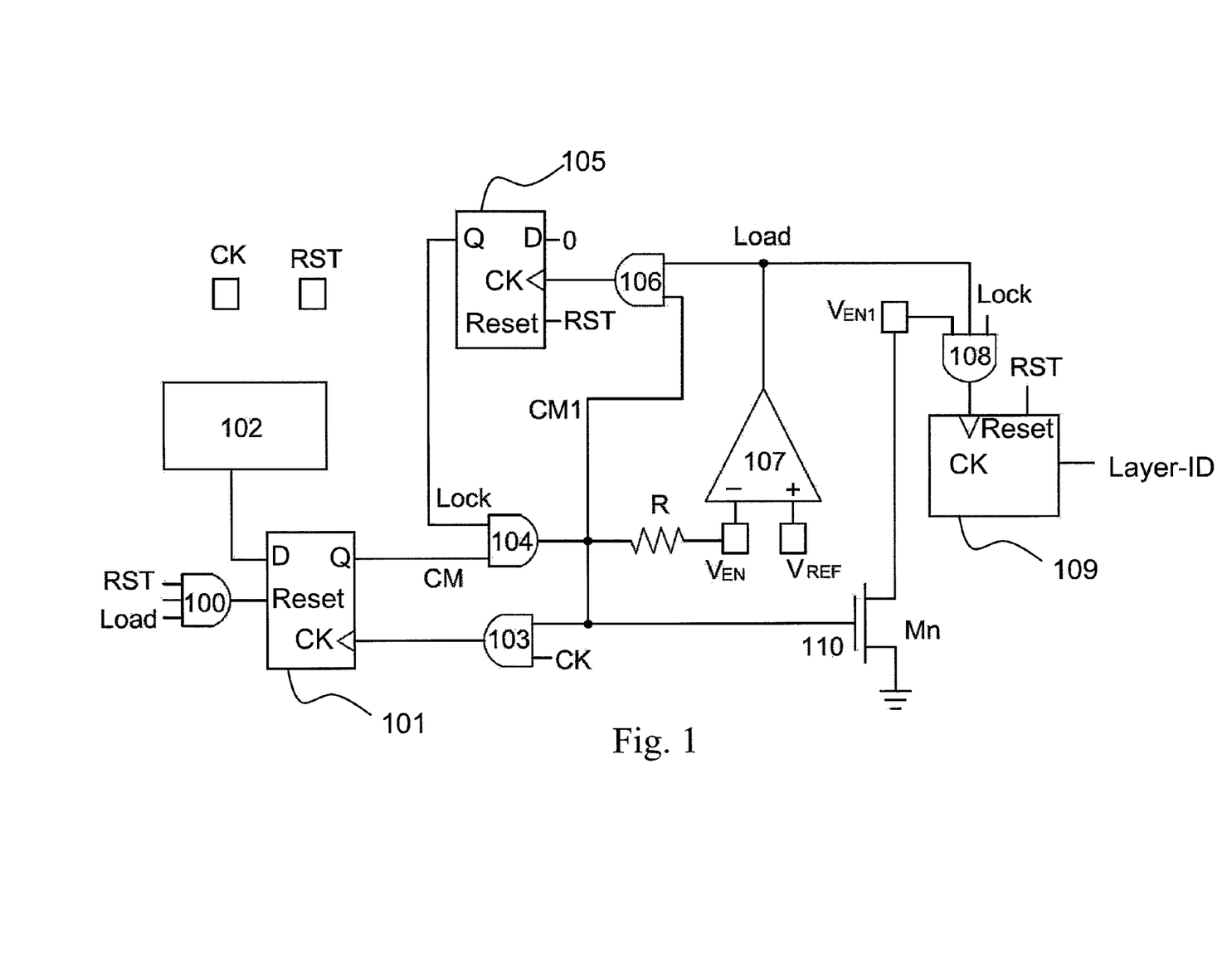
FIG. 1 illustrates a functional block diagram of the layer-ID detector of the present invention.

As shown in FIG. 1, the layer-ID detector structure may include a random generator 102 to generate numeric signals randomly. For example, the random generator 102 may be SRAM, and the output of 1-bit SRAM may act as the source by utilizing the instability of SRAM data when powered on.

The random generator 102 is coupled to a layer-ID designation (voting) mechanism circuit, which may include a number of reset D-type flipflops and a number of AND gates. The truth table of the reset D-type flipflops is as follows:

| D | S | Q |
|---|---|---|
| 0 | 0 | unchanged |
| 0 | 1 | 1 |
| 1 | 0 | 0 |
| 1 | 1 | unpermitted |

The output of the random generator 102 is coupled to a D end of a first reset D-type flipflop 101, and a reset end of the first reset D-type flipflop 101 is coupled with a reset signal, a load and a voltage $V_{EN1}$, wherein a fifth AND gate 100 is coupled to the reset end of the flipflop 101 to input the reset signal, a load signal or $V_{EN1}$.

A clock (CK) end of the first reset D-type flipflop 101 is coupled to the output end of a first AND gate 103. A first input end of the first AND gate 103 is coupled with a clock signal, and a second input end of the first AND gate 103 is coupled to a gate electrode of a transistor 110. A Q end of the first reset D-type flipflop 101 is coupled to a first input end of a second AND gate 104 while a second input end of the second AND gate 104 is coupled to a Q end of a second reset D-type flipflop 105. A reset end of the second reset D-type flipflop 105 is coupled to a reset signal. The output of the second AND gate 104 is coupled with a first input end of a third AND gate 106 and the second input end of the first AND gate 103. The common end of the output of the second AND gate 104 and the second input end of the first AND gate 103 is coupled to a $V_{EN}$ input end (negative input end) of an operational amplifier 107 through a resistance (R); a positive input end of the operational amplifier 107 is coupled with a reference voltage ($V_{REF}$) while a second input end of the third AND gate 106 is coupled to an output end of the operational amplifier 107.

The second input end of the third AND gate 106 is also coupled to a first input end of a fourth AND gate 108, and the other input ends of the fourth AND gate 108 are coupled with a lock signal and a $V_{EN1}$ input signal respectively. The output of the fourth AND gate 108 is coupled with a clock input end of a counter 109 while a reset end of the counter 109 is coupled to a reset signal and the output of the counter 109 is a layer-ID signal.

Figure 5:
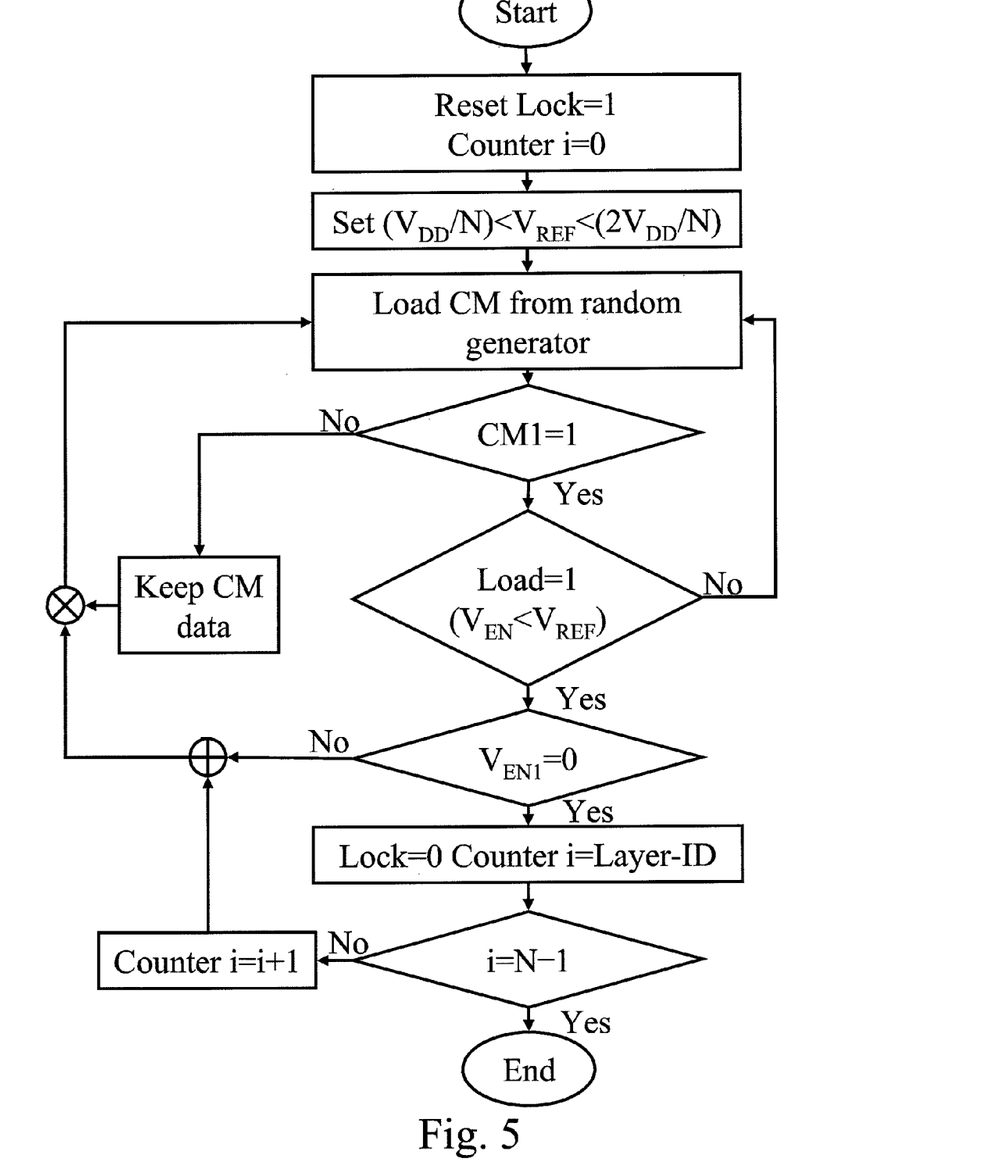
FIG. 5 is a flow chart illustrating the layer-ID detection in accordance with one embodiment of the present invention.
Figure 6:
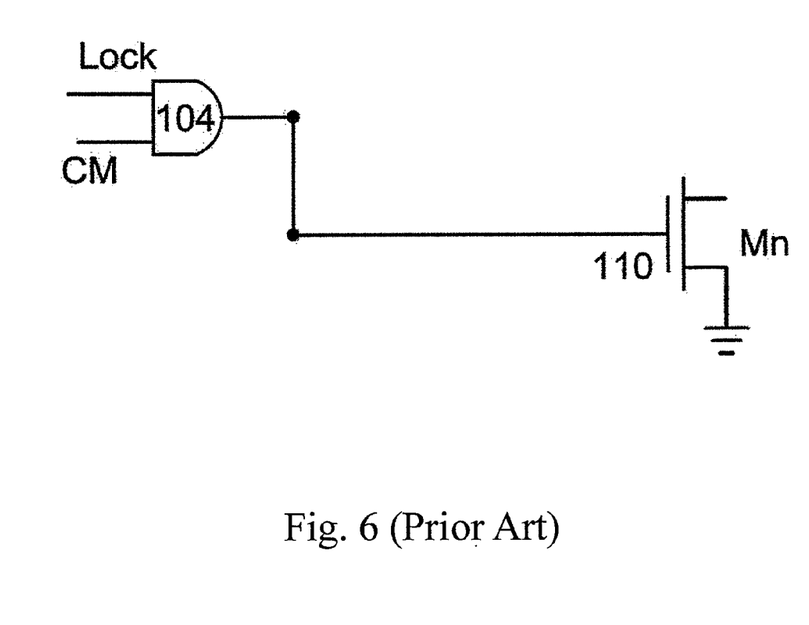
FIG. 6. illustrates a block diagram of a prior art system.

FIG. 5 is a flow chart illustrating the method for executing the present invention. Firstly, a lock signal is reset to 1, and the output of the counter is i=0 at this time. Subsequently, a reference voltage is set to be between $V_{DD}/N$ and $2V_{DD}/N$ (N is the number of the layers). The reference voltage is input into the positive input end of the operational amplifier 107.

Then, a randomly generated signal (for instance CM signal) is loaded from the random generator 102 and input into the D end of the first reset D-type flipflop 101. At this time, whether the loaded CM signal is 1 is determined. If not, keep the CM signal and repeat the preceding step to load a randomly generated signal from the random generator 102; if so, whether the signal loaded and input into the reset end of the first reset D-type flipflop 101 is 1 is further determined. If not, reload a randomly generated signal from the random generator 102; if so and enable voltage ($V_{EN}$) is smaller than the reference voltage ($V_{REF}$) at this time, whether $V_{EN1}$ is zero is further determined. If so, the lock signal is zero and the counter outputs the layer-ID signal. If not, reload a randomly generated signal from the random generator 102.

After completing the aforementioned steps, each layer obtains one bit from the random generator 102. If the value of the bit is "0", keep unchanged. If the value of the bit is "1", obtain the value again and employ the characteristics of the random generator and an operational amplifier to determine when only one "1" remains in the voting mechanism, and then let the lock signal to be "0". In other words, the output CM1 of the second AND gate 104 in FIG. 1 remains to be "0" when the lock signal is "0", which will cause the output value of the counter to also be locked simultaneously at this time and to be outputted as the layer-ID signal.

The identification number of certain layer may be designated until this step, and that layer will leave the designation procedure (i.e. will not join the voting). The remaining unlocked layers will continue to join the layer-ID designation procedure (i.e. join the voting). Subsequently, continue to the next round with the value of the counter plus one and the CM re-obtained from the random generator 102. The number of the layers which join the voting will subtract one every time because the value of CM1 connected with the resistance R remains to be "0" after locked. Then, whether i is equal to (N−1) is determined. If not, continue to perform the layer-ID designation procedure. If so, determine that the layer-ID designation procedure is completed.

Figure 2:
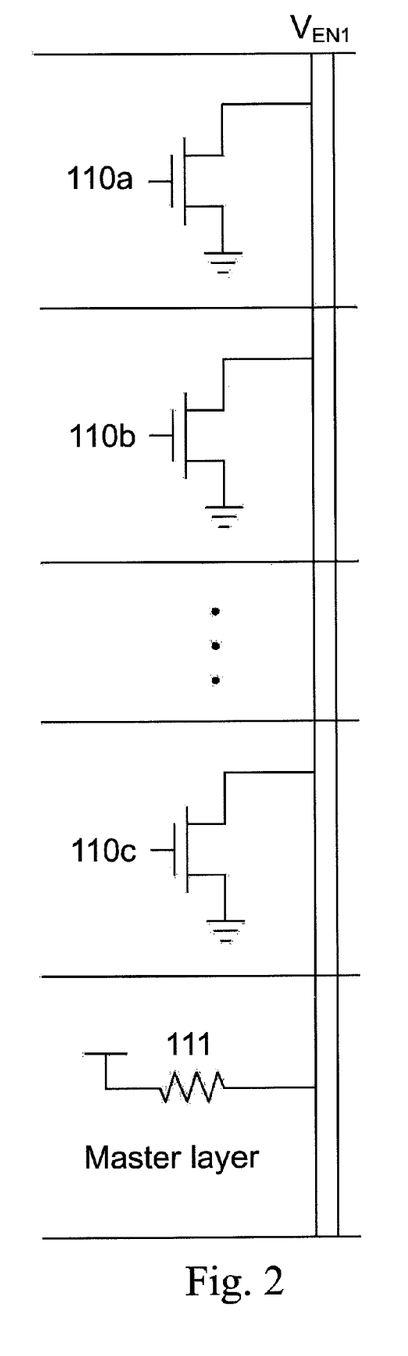
FIG. 2 is a diagram illustrating several layers of the transistor coupled through the TSV technology in accordance with the present invention.
Figure 3:
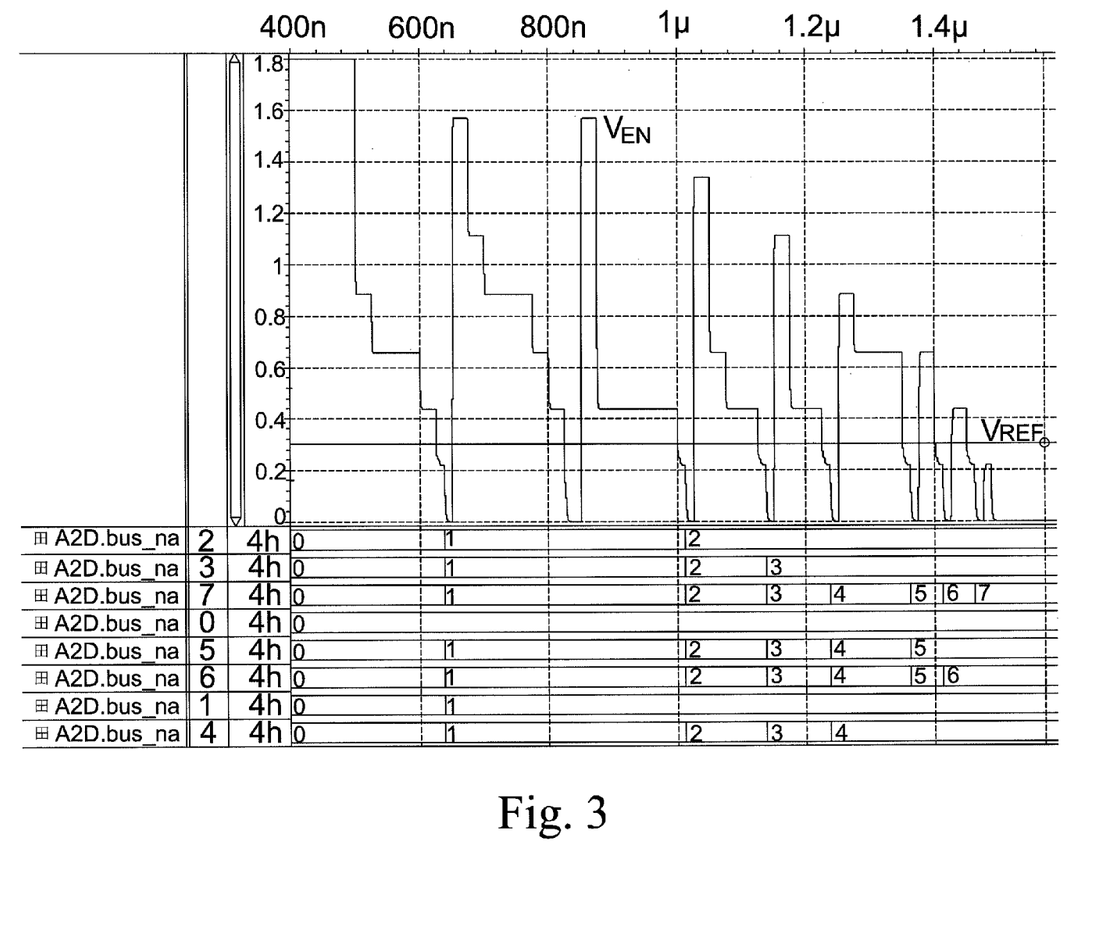
FIGS. 3 and 4 are signal patterns which generate the voting mechanism and the layer-ID.
Figure 4:
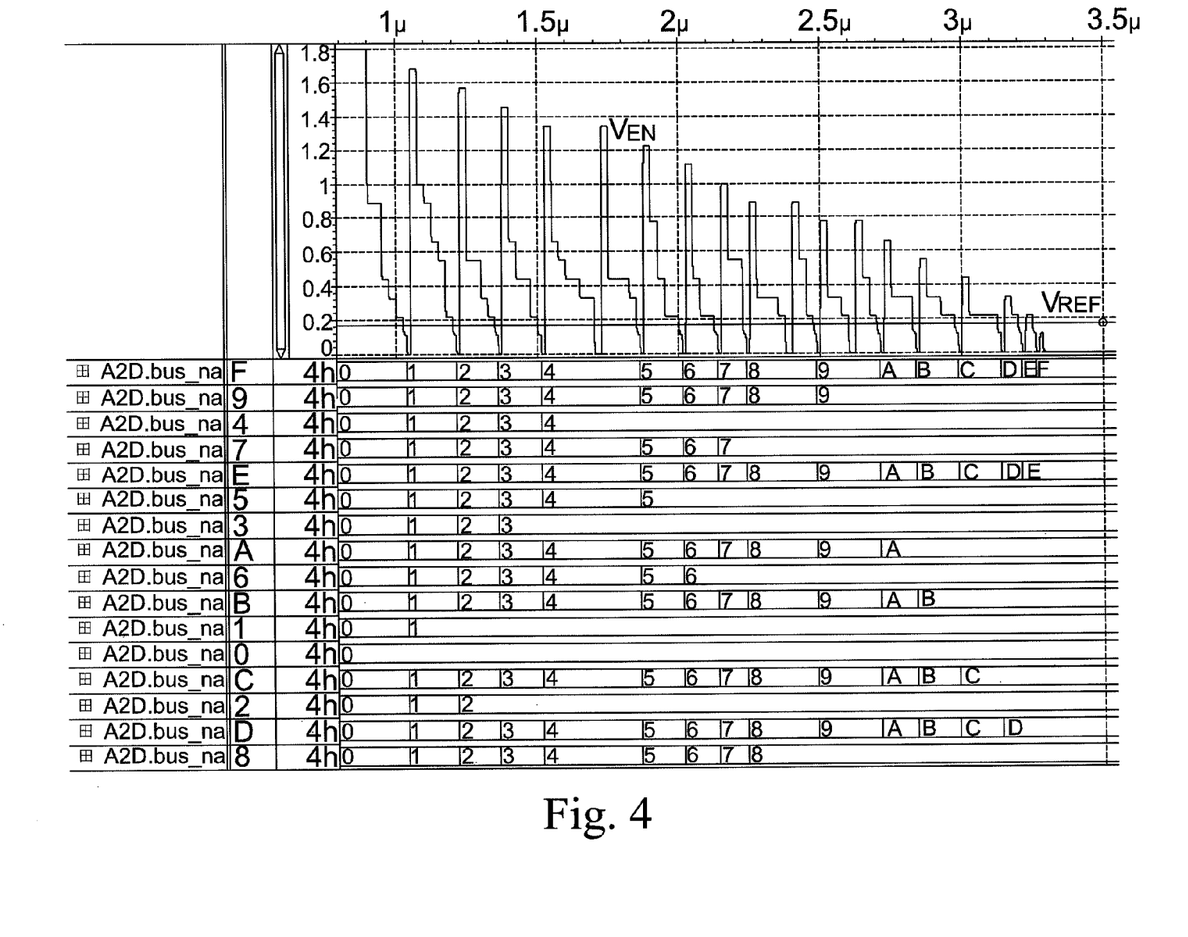

In the present invention, in the determination procedure of the operational amplifier, all the outputted load is "1" when $V_{EN}=V_{DD}/N$ (only one CM1="1") and $V_{EN}=0$ (all CM1="0") because $(V_{DD}/N)<V_{REF}<(2V_{DD}/N)$ is set. The second situation may cause the counter of each layer not to be locked because there is no layer in which CM1="1", but the counter still continues to the next round with the value thereof plus one, thereby resulting in discontinuousness of the layer-ID. Therefore, as shown in FIG. 2, a transistor 110 is introduced and parallel connection is achieved through TSV (through-silicon via) to determine whether all CM1 is "0" ($V_{EN1}$="1") and distinguish between the above two situations which may cause misjudgement. FIGS. 3 and 4 are signal patterns which generate the voting mechanism and the layer-ID. The rectangular frames in FIG. 1 represent the usage of TSV structures.

The layer-ID detector for the 3D-IC and the method thereof provided by the present invention may provide the identification numbers for the integrated chip (3D IC), which may be widely applied to different types of stacked-type semiconductor devices, such as DDR3 DRAM, CMOS image sensor "logic+memory" SIP, (logic, memory, analog, RF sensor, MEMS) chips, flash, nonvolatile memory, etc and therefore the present invention has significant utility. Furthermore, it is an excellent idea and design that the present invention employs the voting mechanism in the layer-ID detection for 3D-IC, and thus the present invention has commercial value. The present invention utilizes the concept of the voting mechanism for the stacked chips to achieve the object of identifying the layer-ID for 3D-IC. Such features are not disclosed in the prior art and the method of the present invention cannot be easily derived from the prior art, such that the present invention shall be non-obvious to the person having ordinary skill in the art.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A layer-ID detector for multilayer 3D-IC, comprising:
   a random generator to generate a random signal;
   a layer-ID designation mechanism circuit coupled to said random generator to generate a layer-ID designating signal; and
   a counter coupled to said layer-ID designating signal to output a layer-ID signal.

2. The detector of claim 1, wherein said layer-ID designation mechanism circuit comprises:
   a first flipflop, an output of said random generator being coupled to an input end of said first flipflop, a clock (CK) end of said first flipflop being coupled to an output end of a first AND gate.

3. The detector of claim 2, wherein said layer-ID designation mechanism circuit further comprises:
   a first input end of said first AND gate being coupled to a clock signal, an output end of said first flipflop being coupled to a first input end of a second AND gate.

4. The detector of claim 3, wherein said layer-ID designation mechanism circuit further comprises:
   a second input end of said second AND gate being coupled to an output end of a second flipflop, a reset end of said second flipflop being coupled to a reset signal.

5. The detector of claim 4, wherein said layer-ID designation mechanism circuit further comprises:
   an output of said second AND gate being coupled to a first input end of a third AND gate and a second input end of said first AND gate.

6. The detector of claim 5, wherein said layer-ID designation mechanism circuit further comprises:
   a common end of said output of said second AND gate and said second input end of said first AND gate being coupled to a $V_{EN}$ input end (negative input end) of an operational amplifier.

7. The detector of claim 6, wherein said layer-ID designation mechanism circuit further comprises:
   a positive input end of said operational amplifier being coupled to a reference voltage ($V_{REF}$), a second input end of said third AND gate being coupled to an output end of said operational amplifier.

8. The detector of claim 7, wherein said layer-ID designation mechanism circuit further comprises:
   an output of a fourth AND gate being coupled to a clock input end of said counter.

9. The detector of claim 8, wherein said second input end of said third AND gate is coupled to a first input end of said fourth AND gate, and the other input ends of said fourth AND gate are coupled to a lock signal and a $V_{EN1}$ input signal respectively.

10. The detector of claim 2, wherein a reset end of said counter is coupled to a reset signal to output said layer-ID signal.

11. The detector of claim 2, wherein a fifth AND gate is coupled to a reset end of said first flipflop to input a reset signal, a load signal or $V_{EN1}$.

12. A method for detecting layer-ID for multilayer 3D-IC, comprising:
    providing a random generator, a layer-ID designation mechanism circuit and a counter;
    generating a random signal by said random generator and inputting said random signal into said layer-ID designation mechanism circuit to generate a layer-ID designating signal; and
    generating a layer-ID signal based on said layer-ID designating signal by said counter.

13. The method of claim 12, further comprising:
    resetting a lock signal to be 1 and letting an output of said counter to be i=0, wherein i is an identification number;
    setting a reference voltage to be between $V_{DD}/N$ and $2V_{DD}/N$; and
    inputting said reference voltage into a positive input end of an operational amplifier of said layer-ID designation mechanism circuit.

14. The method of claim 13, further comprising:
    loading said random signal from said random generator to said layer-ID designation mechanism circuit and determining whether said random signal is 1;
    if so, determining whether a load signal is 1;
    if so and an enable voltage ($V_{EN}$) is smaller than said reference voltage, determining whether $V_{EN1}$ is zero; and
    if so, said lock signal being zero and outputting said layer-ID signal by said counter.

15. The method of claim 14, further comprising:
    obtaining one bit from said random generator by each layer;
    if a value of said bit is "0", keeping unchanged;
    if said value of said bit is "1", obtaining another value again; and
    determining when only one "1" remains in a voting mechanism and letting said lock signal to be "0".

16. The method of claim 14, further comprising:
    if said random signal is not 1, repeating the step of loading said random signal from said random generator.

17. The method of claim 14, further comprising:
    if said load signal is not 1, reloading said random signal from said random generator.

18. The method of claim 14, further comprising:
    if said $V_{EN1}$ is not zero, reloading said random signal from said random generator.

* * * * *